United States Patent
Yang et al.

(10) Patent No.: US 8,723,308 B2
(45) Date of Patent: May 13, 2014

(54) PACKAGES AND METHODS FOR PACKAGING USING A LID HAVING MULTIPLE CONDUCTIVE LAYERS

(75) Inventors: Jicheng Yang, North Andover, MA (US); Asif Chowdhury, Middleton, MA (US); Manolo Mena, Manila (PH); Jia Gao, Winchester, MA (US); Rick Sullivan, Salem, MA (US); Thomas Goida, Windham, NH (US); Carlo Tiongson, Cavite (PH); Dipak Sengupta, Boxborough, MA (US)

(73) Assignee: Analog Devices, Inc., Norwood, MA (US)

( * ) Notice: Subject to any disclaimer, the term of this patent is extended or adjusted under 35 U.S.C. 154(b) by 104 days.

(21) Appl. No.: 13/299,129

(22) Filed: Nov. 17, 2011

(65) Prior Publication Data

US 2012/0126347 A1 May 24, 2012

Related U.S. Application Data

(60) Provisional application No. 61/415,779, filed on Nov. 19, 2010.

(51) Int. Cl.
*H04B 1/06* (2006.01)
(52) U.S. Cl.
USPC .......................................... 257/698; 174/50.5
(58) Field of Classification Search
USPC .................. 257/415, 416, 698, 710; 174/50.5
See application file for complete search history.

(56) References Cited

U.S. PATENT DOCUMENTS

| | | | |
|---|---|---|---|
| 5,175,611 A | 12/1992 | Richardson et al. | |
| 5,291,062 A * | 3/1994 | Higgins, III | 257/698 |
| 5,633,786 A | 5/1997 | Matuszewski et al. | |
| 5,763,824 A | 6/1998 | King et al. | |
| 5,939,784 A | 8/1999 | Glenn | |
| 2001/0022382 A1* | 9/2001 | Shook | 257/415 |
| 2004/0070069 A1 | 4/2004 | Subramanian | |

(Continued)

FOREIGN PATENT DOCUMENTS

| | | | |
|---|---|---|---|
| JP | 63248824 A | * | 10/1988 |
| JP | 2004-186428 | | 7/2004 |
| WO | WO 2007094284 A1 | * | 8/2007 |

OTHER PUBLICATIONS

Liao, Samuel Y., "RF shielding effectiveness and light transmission of copper or silver film coating on plastic substrate," IEEE Transactions on Electromagnetic Compatibility, Nov. 1, 1976, pp. 148-153, vol. EMC-18, No. 4.

(Continued)

*Primary Examiner* — Thomas L Dickey
(74) *Attorney, Agent, or Firm* — Knobbe, Martens, Olson & Bear LLP

(57) ABSTRACT

Packaged integrated devices and methods of forming the same are provided. In one embodiment, a packaged integrated device includes a package substrate, a package lid, and an integrated circuit or microelectromechanical systems (MEMS) device. The package lid is mounted to a first surface of the package substrate using an epoxy, and the package lid and the package substrate define a package interior. The package lid includes an interior coating suited to good adhesion with the epoxy, and an exterior coating suited to RF shielding, where the materials of the interior and exterior coatings are different. In one example, the interior lid coating is nickel whereas the exterior lid coating is tin.

20 Claims, 8 Drawing Sheets

(56) References Cited

U.S. PATENT DOCUMENTS

| | | |
|---|---|---|
| 2007/0013052 A1 | 1/2007 | Zhe et al. |
| 2009/0209216 A1* | 8/2009 | Candelore et al. ............ 455/130 |
| 2009/0301749 A1* | 12/2009 | Tanaka et al. ................ 174/50.5 |
| 2010/0200983 A1 | 8/2010 | Ono et al. |
| 2011/0255726 A1* | 10/2011 | Yu et al. ........................ 381/332 |

OTHER PUBLICATIONS

International Search Report and Written Opinion dated Apr. 24, 2012 in PCT Application No. PCT/US2011/061257.

* cited by examiner

PACKAGES AND METHODS FOR PACKAGING USING A LID HAVING MULTIPLE CONDUCTIVE LAYERS

CROSS-REFERENCE TO RELATED APPLICATIONS

This application claims the benefit under 35 U.S.C. §119 (e) of U.S. Provisional Patent Application No. 61/415,779, filed on Nov. 19, 2010, entitled "PACKAGES AND METHODS FOR PACKAGING," the entire contents of which is hereby incorporated by reference herein.

BACKGROUND OF THE INVENTION

1. Field of the Invention

The present application relates to integrated device packages and methods for packaging the same.

2. Description of the Related Art

Integrated devices, such as integrated circuit (IC) devices or microelectromechanical systems (MEMS) devices, are often secured within a package for a variety of reasons, including, for example, protection from the environment, radio frequency (RF) shielding, and/or to aid in connecting the devices to a larger circuit. The packaged integrated devices can include a package lid mounted to a package substrate. Depending upon the environment of use, the package should also be durable and withstand impact.

There is a need for improved packaging of integrated devices, including improved RF shielding.

SUMMARY OF THE INVENTION

In one embodiment, a packaged integrated device comprises a package substrate, a package lid, and an integrated device die. The package lid is attached to the package substrate using an adhesive, and the package lid and the package substrate can define a package interior. The package lid includes a first conductive layer, a second conductive layer and a core disposed between the first and second conductive layers. The first and second conductive layers comprise different materials. The first conductive layer defines a first surface of the package lid facing the package interior, and the second conductive layer defines a second surface of the package lid opposite the first surface. A portion of the first conductive layer contacts the adhesive. The integrated device die is mounted within the package interior.

In another embodiment, a lid for an integrated circuit or MEMS package includes a core material shaped to define an interior core surface and an exterior core surface. A tin (Sn) coating is on the exterior core surface. A nickel (Ni) coating is on at least a portion of the interior core surface and forms an interface surface of the lid configured for attaching to a package substrate.

In another embodiment, a method of packaging an integrated device comprises providing a lid. The lid comprises a lid core having an inner surface and an outer surface, a first conductive layer covering at least a portion of the inner surface of the lid core, and a second conductive layer covering at least a portion of the outer surface of the lid core. The first and second conductive layers comprise different materials For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein.

DETAILED DESCRIPTION OF EMBODIMENTS

Packaged integrated devices and methods of packaging the same will be described while referring to the accompanying drawings. The drawings are schematic and not to scale.

Packaged Integrated Devices

It can be desirable to improve a packaged integrated device, such as a packaged microelectromechanical systems (MEMS) microphone die, by increasing the strength of adhesion of a package lid to a package substrate. Package lids are sometimes desirable in packaged integrated devices to protect the die from external environmental factors, which may include unwanted particles or contamination, undesirable electromagnetic radiation, moisture, and/or any other external elements that may damage the die or other package components. Adhesives like epoxy may be advantageous when bonding a lid to a package substrate because high temperature soldering processes and attendant contamination issues can be avoided. Yet there is a tendency for such adhesives to demonstrate reduced reliability, particularly upon impact with external components or upon experiencing other external forces. Increasing the adhesion strength of the package lid to the package substrate can improve drop test performance and aid in providing a more mechanically robust packaged integrated device.

At the same time, it can be desirable to improve the radio frequency (RF) shielding of a packaged integrated device to improve operational performance of the device and to increase isolation of the device from electromagnetic radiation. Electromagnetic radiation, including RF waves, may be undesirable in integrated packages because it may interfere with device performance at particular frequencies. For example, when the packaged integrated device includes a MEMS microphone die, improved RF shielding can reduce microphone noise by shielding the microphone die from environmental RF noise. Other types of devices can also benefit from RF shielding. In some embodiments, a conductive lid substantially encloses the integrated device and is electrically connected to ground. The grounded lid may thereby shield the die from undesired electromagnetic interference. Thus, there is a need for packaged integrated devices having both improved lid adhesion with the package substrate and enhanced RF shielding.

Figure 1A:
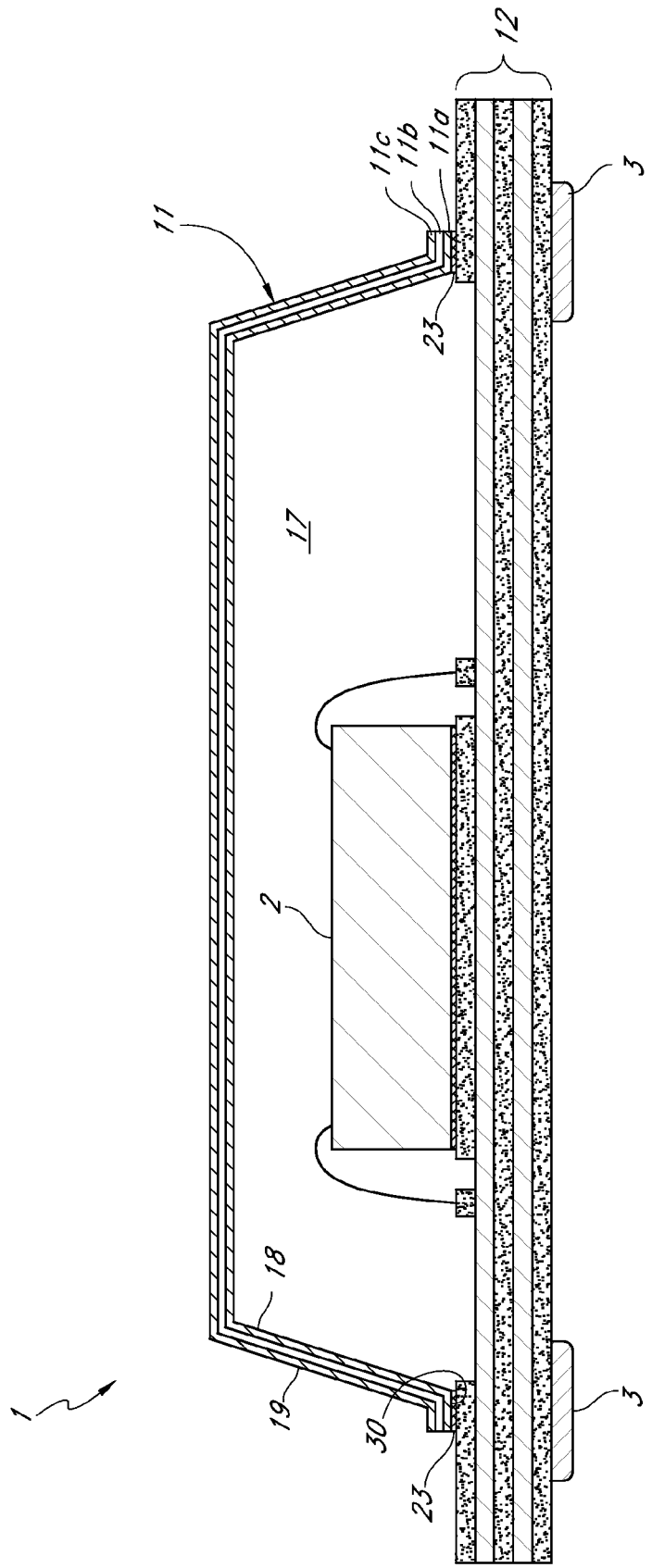
FIG. 1A is a schematic cross-section of a packaged integrated device according to one embodiment.

FIG. 1A is a schematic cross-section of a packaged integrated device 1 according to one embodiment. The packaged integrated device 1 includes a package lid 11 and a package substrate 12, collectively referred to as the package housing. The packaged integrated device 1 further includes an integrated device die 2 disposed on a surface of the package substrate 12. The integrated device die 2 can be, for example, a microelectromechanical systems (MEMS) device, including without limitation a MEMS microphone. The integrated device die 2 could also be any other type of MEMS device, such as a pressure sensor, accelerometer, motion detector, optical sensor, or any other suitable MEMS device. Moreover, in some embodiments, the integrated device die 2 can be any suitable integrated circuit (IC) device. In some embodiments, the integrated device die may include any type of microphone device, including those that are not implemented as a MEMS system. Such non-MEMS microphones include electret condenser microphones (ECM), condenser microphones, and piezoelectric microphones.

The package substrate 12 can be configured to electrically connect the package 1 to a larger electronic device, such as through a printed circuit board (motherboard) and/or any other suitable electrical apparatus. The package substrate 12 can include, for example, one or more power, communication or ground leads, such as the illustrated external leads 3. As is known in the art, the package substrate 12 includes contact pads (shown connected by wirebonding to the integrated device die 2), surface traces, and buried interconnects and/or through vias that electrically connect the integrated device die 2 to the leads 3. The package substrate 12 can be formed from a variety of materials, including, for example, a ceramic package material or a printed circuit board (PCB) material, which may comprise FR-4 board and a metal such as copper. The package substrate 12 may also be a molded leadframe package, including a metal leadframe embedded in plastic, such as liquid crystal polymer (LCP).

The package lid 11 may be a multi-layer lid formed using a plurality of materials. The package lid 11 can include a first conductive layer 11a, a core 11b, and a second conductive layer 11c. Note that the package lid 11 in the illustrated embodiments is not necessarily drawn to scale. The core 11b can be significantly thicker than the layers 11a and 11c in some embodiments, and can provide structural rigidity to the lid 11. As shown in FIG. 1A, the package lid 11 can be mounted to a surface of the package substrate 12 to define a package interior 17. In some embodiments, the package interior 17 may define an air cavity. For instance, in MEMS microphone dies, sound waves may propagate through air within the package interior 17. In still other embodiments, the package interior 17 may be filled with a molding material, such as a plastic or other suitable material.

In the illustrated embodiment, the first conductive layer 11a is disposed on at least a portion of an interior surface of the core 11b. The first conductive layer 11a can thereby define part or all of an interior surface 18 of the lid 11. The first conductive layer 11a defines at least an interface surface portion 30 of the interior surface 18. In some embodiments, the first conductive layer 11a can be disposed on all or substantially all of the interior surface of the core 11b and thus define the entire interior surface 18 of the lid 11, as shown. In other embodiments, the first conductive layer 11a may only be disposed on a portion of the interior surface of the core 11b to form the interface portion 30. The majority of the interior surface 18 faces the package interior 17, although after mounting, the interface surface portion 30 faces the package substrate 12 on which it is mounted. The second conductive layer 11c is disposed on an exterior surface of the core 11b to form exterior surface 19 of the lid 11 opposite the interior surface 18. The core 11b is disposed between the first conductive layer 11a and the second conductive layer 11c.

In some embodiments, the package lid 11 can be attached to the package substrate 12 using an adhesive 23. The adhesive 23 can be an organic material, particularly an epoxy, such as the epoxy sold under the trade name CE-3920 by Henkel AG & Co. KGaA, which is headquartered in Dusseldorf, Germany. In some embodiments, the epoxy is electrically conductive, so as to provide an electrical connection between the lid 11 and metallic traces within or on the package substrate 12. A portion of the first conductive layer 11a contacts the adhesive 23. As will be described in further detail below, the first conductive layer 11a can be selected to aid in improving the strength of the bond formed between the package lid 11 and the package substrate 12 using the adhesive 23. Thus, employing the first conductive layer 11a can improve adhesion of the package lid 11 to the package substrate 12 relative to a package design omitting the first conductive layer 11a in favor of connecting the core 11b to the package substrate 12 by way of the adhesive. Using the first conductive layer 11a can also improve adhesion relative to connecting the material of the second conductive layer 11c to the package substrate 12 by way of the adhesive.

The first conductive layer 11a can comprise a variety of materials that provide good adhesion to the adhesive (particularly epoxy), such as nickel (Ni), gold (Au), silver (Ag) and/or copper (Cu). In one embodiment, the first conductive layer 11a is selected to be a material with a melting temperature greater than about 260° C. In this embodiment, the high melting temperature aids in providing robust lid attachment when using a solder reflow process to attach the package substrate 12 to a printed circuit board (i.e., during board mounting) or other electrical apparatus.

To aid in providing electrical connectivity, radio frequency (RF) shielding, and/or to reduce static charge build-up, the package lid 11 can be electrically connected to the package substrate 12. For example, the package lid 11 can be electrically grounded by attaching the package lid 11 to a trace of the package substrate 12 electrically coupled to one of the external leads 3 that is connected to ground. To reduce the impedance between the package lid 11 and the package substrate 12, the first conductive layer 11a can have a relatively low contact resistance. In one embodiment, the first conductive layer 11a has a contact resistance with a conductive trace that is less than about 1 mΩ per 1.6 cm². Additionally, in this embodiment it is desirable to mount the lid 11 via a conductive epoxy.

The core 11b can be a variety of materials, including, for example, stainless steel, copper (Cu) and/or aluminum (Al). The core 11b can also include any suitable plastic, including, for example, a liquid crystal polymer (LCP). Although the core 11b is illustrated as a single layer in FIG. 1A, the core 11b can include a plurality of layers. The core 11b can provide structural rigidity to the lid 11 to aid in achieving a desired mechanical strength. The thickness of the core 11b can be greater than that of the first and second conductive layers 11a, 11c. For example, as will be described in detail below with respect to FIGS. 2A-2E, the core 11b can be shaped to define an interior surface and an exterior surface, and the conductive layers 11a, 11c can be provided as coatings on the core 11b. In the illustrated embodiment, the lid is shaped with a concavity to define the package cavity within which the integrated device die 2 is mounted; in other arrangements, the cavity can be defined by other features (e.g., relief in the mounting substrate, a molded plastic substrate, etc.), and the lid can be shaped to be planar. For example, a planar lid can be shaped to indirectly attach to a package substrate by way of a mounting structure coupled to the package substrate. In some embodiments, the mounting structure can form an annulus on the package substrate, with the interior of the annulus defining a cavity. The planar lid can then be mounted to the annular mounting structure and over the cavity.

The second conductive layer 11c can define part or all of the exterior surface 19 of the package lid 11, and can be used to improve radio frequency (RF) shielding of the packaged integrated device 1. For example, the second conductive layer 11c can have a composition and thickness selected to obtain a maximum of about −70 dB of electromagnetic radiation interference for an RF signal having a frequency ranging between about 0.8 GHz to about 3 GHz. The second conductive layer 11c can comprise any of a variety of materials, such as tin (Sn), silver (Ag), gold (Au), and/or copper (Cu). In one embodiment, the maximum RF conductance of the second conductive layer 11c is less than about 50 Siemen-squares for electromagnetic interference at a frequency of less than about 0.8 GHz, and the maximum RF conductance is less than about 20 Siemen-squares for electromagnetic interference at a frequency of about 3.0 GHz.

To aid in providing enhanced RF shielding, the second conductive layer 11c can have a relatively low relative permeability and a relatively low bulk resistivity. In one embodiment, the second conductive layer 11c has a bulk resistivity of less than about 0.1 μΩ-m and a relative permeability of approximately 1.

In one example, the interior surface 18, and particularly the interface surface 30 thereof, can be defined by a nickel (Ni) coating while the exterior surface 19 can be defined by a tin (Sn) coating. In this example, the first conductive layer 11a may be formed of Ni, while the second conductive layer 11c may be formed of Sn. In other embodiments, however, both the interior and exterior surfaces of the core 11b may be coated with Ni, while the exterior surface can additionally be formed with Sn.

Figure 1B:
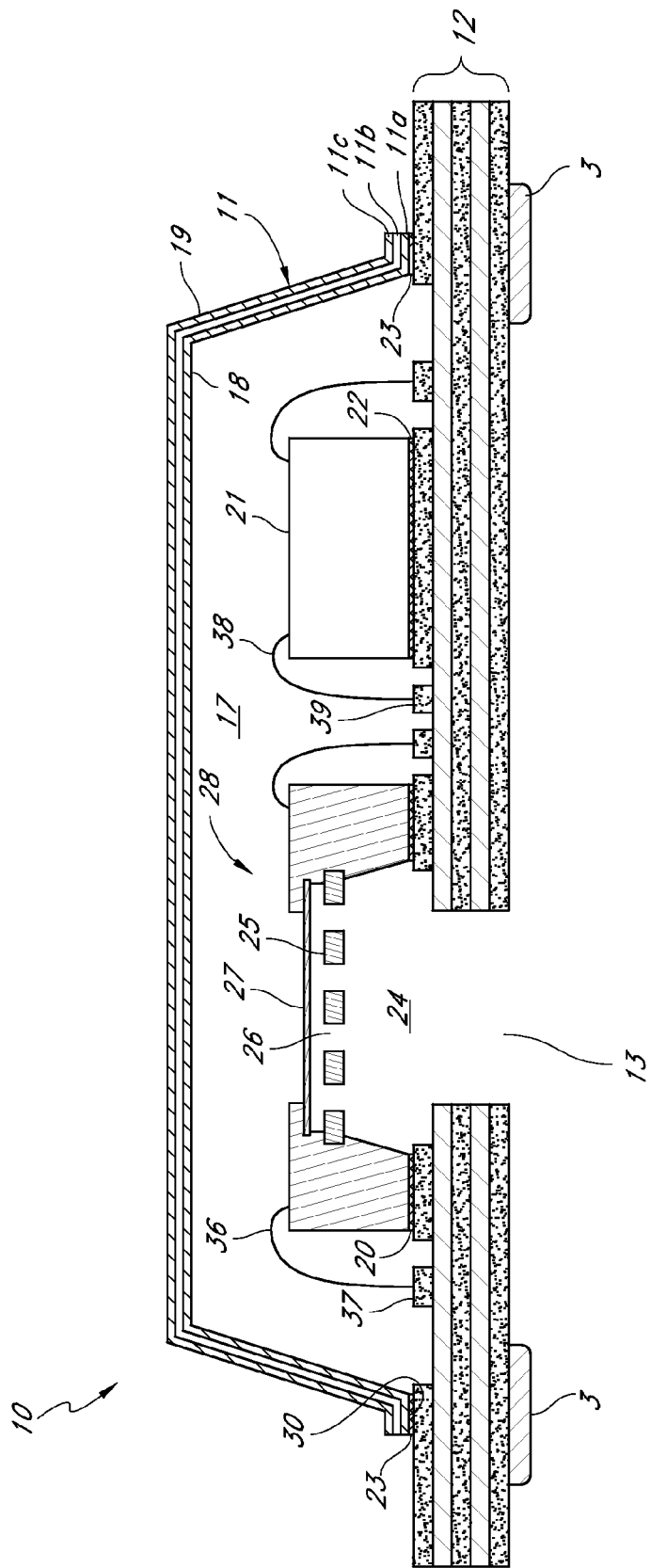
FIG. 1B is a schematic cross-section of a packaged MEMS microphone device and processing integrated circuit according to another embodiment.

FIG. 1B is a cross-section of a packaged MEMS microphone device 10 according to one embodiment. The packaged MEMS microphone device 10 includes a package substrate 12, a package lid 11, a MEMS microphone die 28, and an integrated circuit die 21.

As shown in FIG. 1B, the package lid 11 is secured to the package substrate 12 using the adhesive 23, and the package lid 11 and the package substrate 12 define a package interior 17. The package lid 11 has an interior surface 18 and an exterior surface 19.

The package substrate 12 can comprise ceramic package material or a printed circuit board (PCB) material, such as alternating layers of FR-4 board and copper. The package substrate 12 can include ground, power and signal leads 3 for electrically communicating with a printed circuit board or other apparatus. The package substrate 12 can also include a sound channel or port 13, which forms a passage through the package substrate 12, thereby allowing ingress of audio signals from a package exterior to the package interior 17.

The MEMS microphone die 28 can be mounted onto the package substrate 12 over the sound port 13. For example, a microphone die adhesive 20, such as a conductive or nonconductive epoxy, can be used to mount the MEMS microphone die 28 over the sound port 13. The packaged MEMS microphone device 10 can also include the integrated circuit die 21, which can be mounted on the package substrate 12 using an integrated circuit die adhesive 22, which can be implemented by using the same or a different material as the microphone die adhesive 20. Alternatively, the IC die 21 can be flip-chip mounted, e.g., by way of solder balls. The integrated circuit die 21 can be used to process data from the MEMS microphone die 28, and in some embodiments it is an application specific integrated circuit (ASIC). Skilled artisans will appreciate that in some embodiments, the integrated circuit die 21 need not be included and that the MEMS microphone die 28 can be mounted within the package interior 17 in other locations, including, for example, on the package lid 11. Additionally, although the packaged MEMS microphone device is illustrated as including the sound port 13 in the package substrate 12, the sound port 13 can be provided in other locations, such as on the package lid 11 for a top port microphone package.

With continuing reference to FIG. 1B, the illustrated MEMS microphone die 28 includes a die cavity 24, a movable membrane 27, and a backplate 25. During operation of the microphone, audio signals can reach a first side of the movable membrane 27, and the movable membrane 27 can be deflected by a pressure difference between the first, and a second, opposing side of the membrane. The backplate 25 can be fixed and can be separated from the movable membrane 27 by a gap, and therefore can serve in conjunction with the movable membrane 27 to form electrodes of a variable capacitor that can be configured to detect audio signals. In the illustrated configuration, the backplate 25 includes backplate apertures 26, which allow the membrane 27 to communicate with the die cavity 24. Audio signals can cause the movable membrane 27 to vibrate relative to the fixed backplate 25, thereby producing a changing capacitance. In other arrangements, sound can reach the movable membrane from the opposite side, and backplate apertures can be omitted, or can be provided simply to reduce pressure resistance to membrane vibrations. The MEMS microphone die 28 can be formed, for example, using a silicon or silicon on insulator (SOI) wafer.

In the embodiment illustrated in FIG. 1B, microphone die leads 36 are connected to package substrate traces 37 or bonding pads so that the MEMS microphone die 28 can communicate electrical signals that can be further processed and used by external circuitry (e.g. a mobile phone device). Similarly, the illustrated integrated circuit die 21 may communicate with other devices using integrated circuit die leads 38 connected to other substrate traces 39. Although the illustrated integrated circuit die 21 is shown as wirebonded, persons of ordinary skill in the art will recognize that the integrated circuit die 21 could be connected in other ways. For example, solder bumps could be deposited onto chip pads on the top side of the integrated circuit die 21, and after flipping the die upside down and aligning the chip pads to matching pads on the package substrate 12, the solder could be flowed so as to interconnect the die and the substrate. Other methods of interconnecting chips to package substrates include the use of anisotropic conductive filler (ACF), as will be appreciated by the person of ordinary skill in the art.

As with the packaged device 1 of FIG. 1A, for packaged MEMS microphone devices 10, it may be desirable to increase the adhesive strength of the bond between the lid 11 and the package substrate 12. In some embodiments, the lid 11 may be attached to the package substrate 12 by using an adhesive 23. The adhesive 23 may be similar to that described above with respect to the embodiment of FIG. 1A, and the adhesive 23 may comprise a conductive epoxy material. The lid 11 may comprise a first conductive layer 11a, a core layer 11b, and a second conductive layer 11c. As with FIG. 1A, the first conductive layer 11a can be selected to aid in improving the strength of the bond formed between the package lid 11 and the package substrate 12 using the adhesive 23. To improve adhesion, the first conductive layer 11a may be formed on at least part of the interior surface of the lid core 11b to define all or part of an interior surface 18 of the lid 11. The first conductive layer 11a defines at least an interface surface 30 facing the package substrate. The first conductive layer 11a may be formed of any suitable conductive material, including the materials listed above with respect to FIG. 1A. In some embodiments, the first conductive layer 11a may be formed of a nickel layer. The core layer 11b may also be formed of materials described above with respect to FIG. 1A.

In MEMS microphone devices, electromagnetic or RF interference may introduce undesirable noise into the microphone signals. RF shielding may therefore be an important objective in MEMS microphone design to ensure a clear output microphone signal. RF shielding is important for packaging other types of devices as well. As with FIG. 1A, the second conductive layer 11c of FIG. 1B can define part or all of the exterior surface 19 of the lid 11, and the second conductive layer 11c is selected to improve RF shielding. In some aspects, the second conductive layer 11c can be formed of a tin (Sn) layer. Thus, the adhesion of the lid 11 to the package substrate 12 can be improved and RF interference can be reduced by selecting the first conductive layer 11a to improve adhesion to the package substrate 12 (by way of the adhesive 23) and by selecting the second conductive layer 11c to reduce RF interference.

FIGS. 2A-2E are cross-sections illustrating manufacturing processes for package lids 11 according to various embodiments.

Figure 2A:
FIGS. 2A-2E are schematic cross-sections illustrating manufacturing processes for package lids according to various embodiments.

In FIG. 2A, a core 11b has been provided. The core 11b can comprise for example, stainless steel, copper (Cu) and/or aluminum (Al). The core 11b can also include any suitable plastic, including, for example, a liquid crystal polymer (LCP). As was described above, the core 11b can be selected to provide structurally rigidity to a package lid. As noted above, while the lid can be planar, as shown, in some embodiments the lid is shaped three-dimensionally to define a concavity. The lid can be shaped as desired before or after the coating steps described with respect to FIGS. 2A-2E.

Figure 2B:
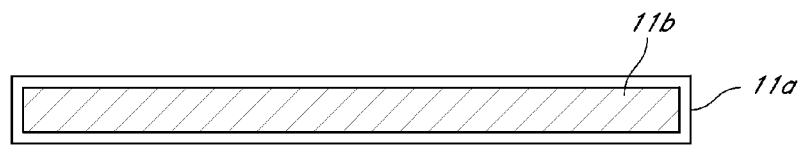

In FIG. 2B, the core 11b has been plated with a first conductive coating 11a on a plurality of sides and major surfaces. The first conductive coating 11a can be provided using, for example, any suitable plating process, such as electroplating. Although not illustrated in FIG. 2B, a seed layer can be provided using, for example, a sputter process, before forming the first conductive coating 11a. Employing a seed layer can be useful in a variety of circumstances, particularly when the core 11b is non-conductive, e.g., a plastic. If employed, the seed layer can be considered part of the core 11b in the resultant product.

As was described above, the first conductive layer or coating 11a can comprise a material suitable for improving the attachment strength of the package lid to a package substrate when using an adhesive like epoxy. Thus, employing the first conductive coating 11a can improve adhesion of the package lid 11 to the package substrate 12 relative to a package design that directly mounts the core 11b to a package substrate. In one embodiment, the first conductive coating 11a comprises nickel (Ni). However, the first conductive coating 11a can be formed from other materials as described above.

Figure 2C:
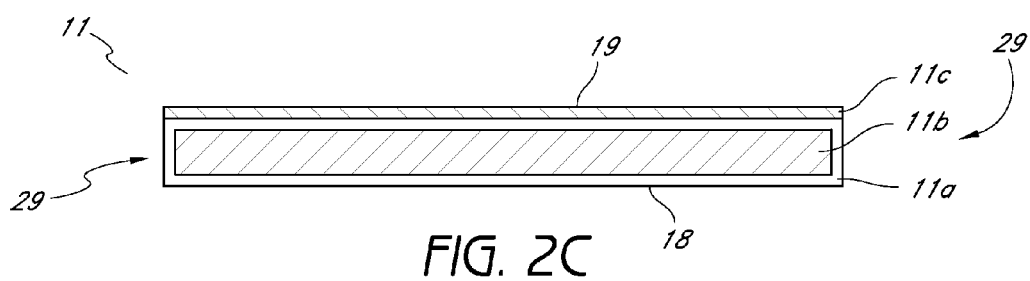

FIG. 2C illustrates forming a second conductive layer or coating 11c on one surface of the partially fabricated package lid of FIG. 2B. For the RF shielding applications mentioned above, the coating 11c can define the exterior surface 19 of the lid that will face the exterior of the completed package. Forming the second conductive coating 11c can include masking one or more surfaces and sides 29 of the partially fabricated package lid of FIG. 2B, including the surface 18 that will face the interior of the completed package. The second conductive coating 11c can then be plated, and the masking layer removed. However, skilled artisans will appreciate that the second conductive coating 11c can be selectively formed on the exterior of the lid in other ways. In the illustrated embodiment, due to selective coating, while the first conductive coating 11a is initially formed on all sides and surfaces of the lid core material 11b, in the finished lid the first conductive coating 11a is exposed on the interior surface 18 while the second conductive coating is exposed on the exterior surface 19 of the lid. In some embodiments, masking can be provided by a tape layer, but one of skill in the art would recognize that any other suitable masking materials or apparatuses could be used to mask surfaces of the lid during selective coating.

The second conductive coating 11c can be used to provide radio frequency (RF) shielding for a packaged integrated device, such as those illustrated in FIGS. 1A-1B. The second conductive coating 11c can comprise tin (Sn) or other suitable material, as described above.

Including both the first conductive coating 11a and the second conductive coating 11b can improve the performance of a packaged integrated device relative to a design which employs neither or only one of the first and second conductive coatings 11a, 11c. For example, the first conductive coating 11a can be selected to improve lid attachment strength and can have an attachment strength to the adhesive (such as an epoxy) which is greater than that of the second conductive coating 11c. Additionally, the second conductive coating 11c can be selected to enhance RF shielding provided by the package lid, and can have a RF conductivity less than that of the first conductive layer 11a. Thus, by employing the first and second conductive coatings 11a, 11c, exposed on different surfaces of the lid, the performance of the package lid can be improved.

The coating steps can be conducted efficiently on sheet material (e.g., sheet metal) that forms the lid core 11b, and the package lid 11 of FIG. 2C can be subsequently stamped, sawed, etched and/or otherwise three-dimensionally shaped to form a package lid similar to those illustrated in FIGS. 1A-1B. However, the package lid 11 of FIG. 2C need not be three-dimensionally shaped, and can be employed in an integrated device package having a cavity predefined by the remainder of the packaging material, e.g., in an etched package substrate. For example, an integrated device can be mounted in the cavity of the etched package substrate, and a substantially flat package lid can be mounted over the etched package substrate using an epoxy. Alternatively, as noted above, the core material can be three-dimensionally shaped prior to coating.

Figure 2D:
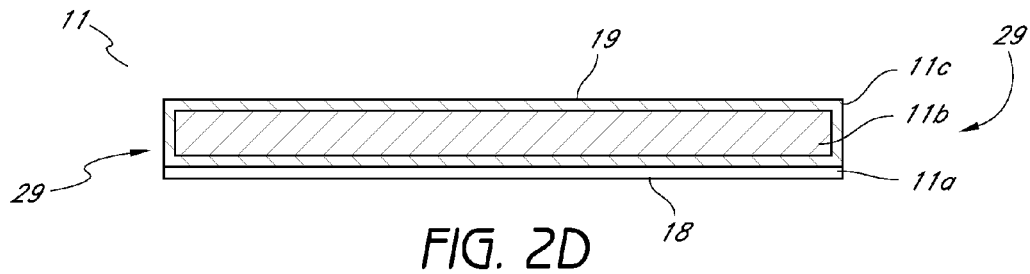

FIG. 2D illustrates a package lid according to another embodiment. The package lid 11 of FIG. 2D is similar to that of FIG. 2C, except that the second conductive coating 11c has been provided over a plurality of sides and major surfaces of the core 11b, and the first conductive coating 11a has been provided on one surface of the second conductive coating 11c. Skilled artisans will appreciate that the package lid of FIG. 2D can be fabricated in a manner similar to that described above. The package lid of FIG. 2D can be subsequently stamped and/or diced as described above, and can be shaped to define a package cavity or employed without three-dimensional shaping in a packaged integrated device having a cavity predefined by the package substrate. The first conductive coating 11a can define the surface 18 that will face the interior of the completed package, while the second conductive coating 11c can define the surface 19 that will face the exterior of the completed package. Of course, a person skilled in the art would recognize that for various applications, the ordering of layers may be different, and a variety of suitable conductive materials, as described above, can be used for the coating layers 11a and 11c.

Figure 2E:
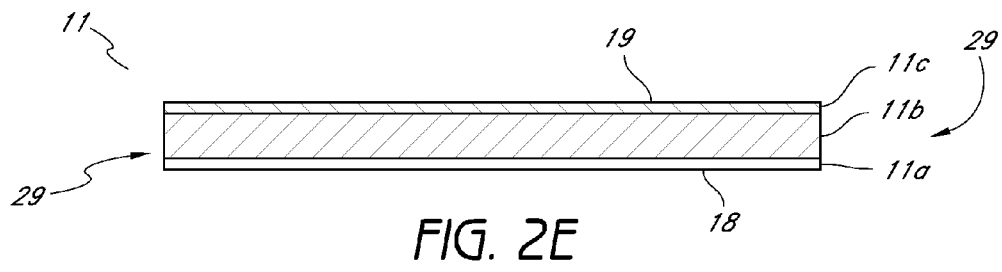

FIG. 2E illustrates a package lid 11 according to another embodiment. As shown, the package lid 11 includes a core 11b having a first conductive coating 11a formed on a first surface of the core 11b, and a second conductive coating 11c formed on a second surface of the core 11b opposite the first surface. The package lid 11 of FIG. 2E can be formed using any suitable process. For example, the second surface of the core 11b can be masked, and an electroplating process can be used to form the first conductive coating 11a on the first surface of the core 11b. Thereafter, the mask can be removed, and a mask can be provided over the first conductive coating 11a. An electroplating process can then be used to form the second conductive coating 11c, and the mask can subsequently be removed to form the package lid 11 of FIG. 2E. Skilled artisans will appreciate that the package lid 11 of FIG. 2E can be formed in a variety of alternate ways, and the coating application may be performed in a variety of sequences. While the side edges 29 are shown uncoated, they could be coated by either or both coatings 11a, 11c.

Figure 3A:
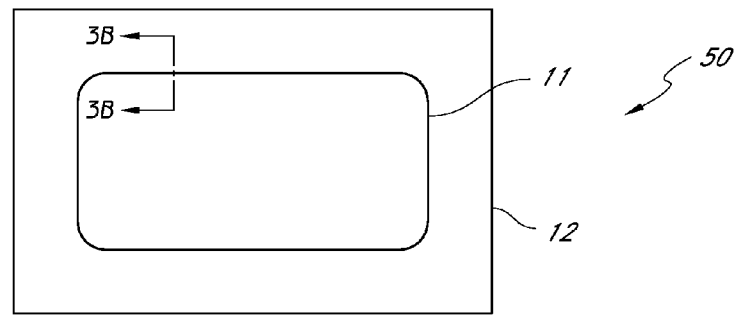
FIG. 3A is a top plan view of a packaged integrated device according to one embodiment.
Figure 3B:
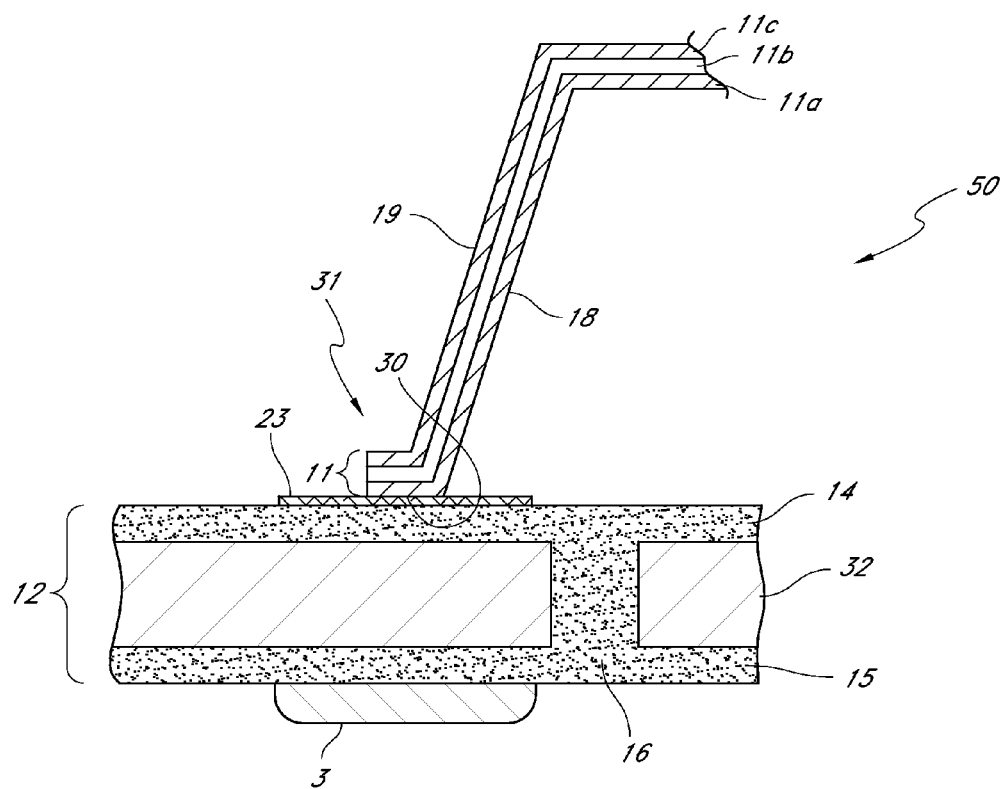
FIG. 3B is a cross-section of the packaged integrated device taken along the lines 3B-3B of FIG. 3A.

FIG. 3A is a top plan view of a packaged integrated device 50 according to one embodiment. FIG. 3B is a cross-section of the packaged integrated device 50 taken along the lines 3B-3B. The packaged integrated device 50 includes a lid 11 and a package substrate 12. As illustrated, the package lid 11 can be mounted onto a conductive trace 14 of the package substrate 12 using an adhesive 23, particularly an epoxy (which may be electrically conductive). The conductive trace 14 can be electrically connected using a via 16 to another conductive trace 15 or contact pad on an opposite surface of the package substrate 12. The conductive trace 15 or contact pad can be electrically connected to one of the leads 3 that is connected to ground to aid in grounding the package lid 11. A bonding layer 32, which can be a nonconductive layer for example, can be disposed between conductive traces 14 and 15.

The illustrated package lid 11 includes an interior surface 18 and an exterior surface 19. The first conductive layer 11a defines part or all of the interior surface 18 and the second conductive layer 11c defines part or all of the exterior surface 19. The interior surface 18 can include an interface surface 30 defining a portion of the first conductive layer 11a mounted to the package substrate 12 using the adhesive 23. The interface surface 30 may be defined on a lip portion 31 of the lid 11, extending outwardly at the perimeter of the lid 11. Additional details of the integrated package device 50 can be similar to those described above. Particularly, the first conductive layer 11a (e.g., Ni) can be selected to improve adhesion by way of the epoxy adhesive 23, whereas the second conductive layer 11c (e.g., Sn) can be selected for enhanced RF shielding.

Figure 4A:
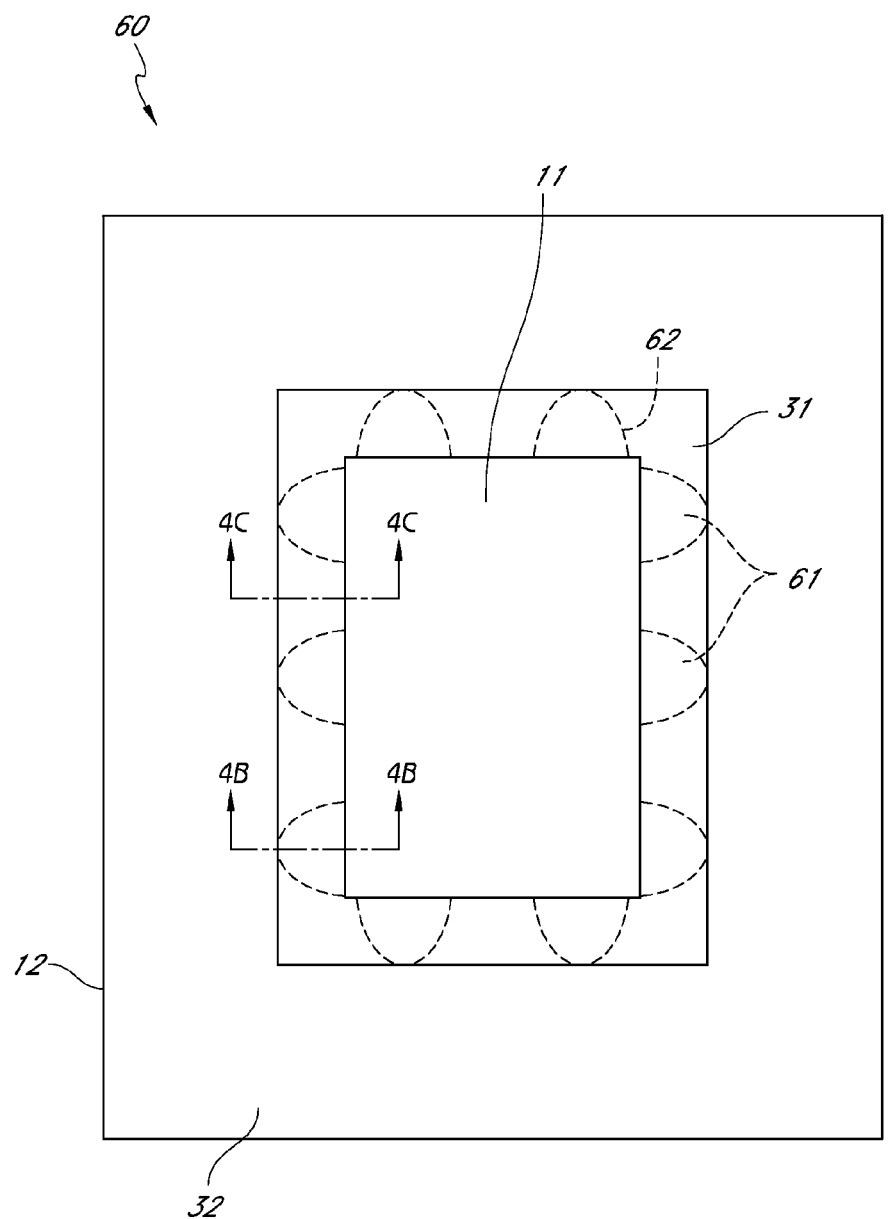
FIG. 4A is a top plan view of a packaged integrated device according to another embodiment.
Figure 4B:
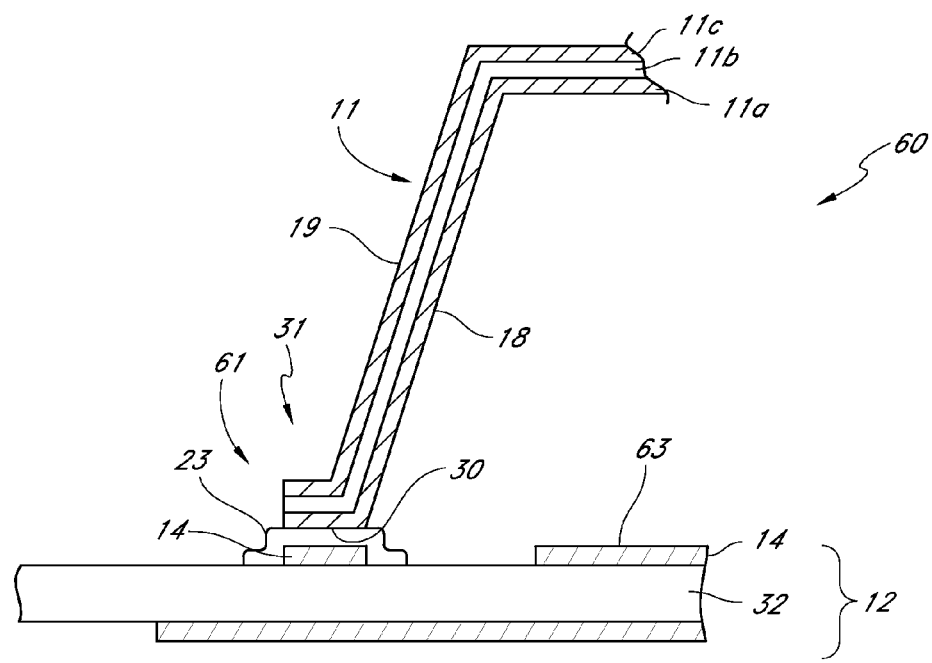
FIG. 4B is a cross-section of the packaged integrated device taken along the lines 4B-4B of FIG. 4A.
Figure 4C:
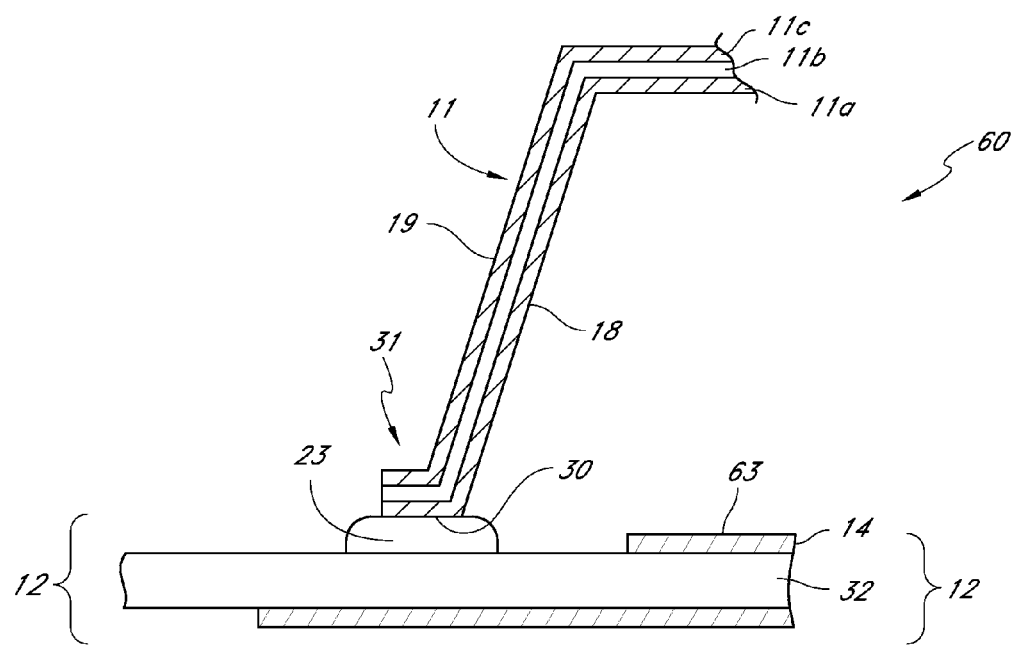
FIG. 4C is a cross-section of the packaged integrated device taken along the lines 4C-4C of FIG. 4A.

FIG. 4A is a top plan view of a packaged integrated device 60 according to another embodiment. FIG. 4B is a cross-section of the packaged integrated device 60 taken along the lines 4B-4B. FIG. 4C is a cross-section of the packaged integrated device 60 taken along the lines 4C-4C. The packaged integrated device 60 includes a package lid 11 and a package substrate 12. As described above, the lid 11 of FIGS. 4A-4C comprises the first conductive layer 11a and the second conductive layer 11c, in addition to the core 11b. As above, the first conductive layer 11a can be selected to improve adhesion between the lid 11 and the adhesive 23 for attachment to the package substrate 12. The second conductive layer 11c can be selected to enhance RF shielding for the packaged integrated device 60. The first conductive layer 11a can define part or all of an interior surface 18 of the lid 11, and the second conductive layer 11c can define part or all of an exterior surface 19 of the lid 11.

In contrast to the packaged integrated device 50 of FIGS. 3A-3B, the packaged integrated device 60 includes locking features 61 for improving adhesion of the package lid 11 to the package substrate 12. In the illustrated embodiment, the locking features 61 are formed by patterning a conductive layer to form a patterned conductive trace 14 in the region of the package substrate 12 corresponding to the interface surface 30 of the package lid 11 to expose an underlying bonding layer 32 to the adhesive 23. In some embodiments, the adhesive 23 can have a relatively greater bonding strength to the underlying bonding layer 32 than to the conductive trace 14 of which the locking features 61 are part. In some cases, the underlying bonding layer 32 is a nonconductive layer of the package substrate 12, such as a pre-impregnated composite material layer. By enabling bonding between the lid 11 and the bonding layer 32 via a conductive adhesive (e.g., epoxy), the locking features 61 can thus improve lid adhesion while still permitting electrical contact for grounding.

In the embodiment of FIGS. 4A-4C, the lid 11 is bonded to the package substrate 12. The lid 11 may include a lip 31 that extends at the perimeter of the lid 11 to form the interface surface 30. As shown in FIGS. 4A-4C, the lid 11 may be positioned on the package substrate 12 such that the lip 31 attaches to the package substrate 12 at the lid's interface surface 30 through both the patterned locking features 61 (part of the trace 14) and the exposed bonding layer 32. The lip 31 of the lid 11 may be attached to the substrate 12 using an adhesive 23. As noted above, the adhesive 23 may be formed of any suitable adhesive material, although in some embodiments, as described above, a conductive epoxy material may be desired to facilitate electrical connection between the lid 11 and traces within the package substrate 12. Note that the dimensions of the lip 31 and locking features 61 are exaggerated for purposes of illustration in FIGS. 4A-4C.

In the embodiment illustrated in FIG. 4A, the locking features 61 form a zigzag or alternated pattern 62 (shown by dashed lines) at the perimeter of the lid 11 when viewed from above. However, persons of ordinary skill in the art will appreciate that other patterns are possible. As shown in FIG. 4A, the lip 31 of the lid 11 attaches to the patterned locking features 61 and the bonding layer 32 of the package substrate 12. In some cases, the lip 31 of the lid 11 substantially covers the locking features 61. In other cases, the lip 31 may cover only a portion of the locking features 61.

FIG. 4B shows a cross-section of FIG. 4A through one of the locking features 61, taken along lines 4B-4B in FIG. 4A. The package lid 11 is shown as including the first conductive layer 11a, the core 11b, and the second conductive layer 11c.

In this embodiment, the package substrate 12 includes the conductive trace 14 and bonding layer 32. The bonding layer 32 can be a nonconductive layer, such as a pre-impregnated composite material layer. The conductive trace 14 will generally define other conductive features on the surface of the substrate 12, such as a bond pad 63.

In some embodiments, therefore, adhesion between the lid 11 and the package substrate 12 may be enhanced by both the selection of the first conductive layer 11a and the design of the locking features 61 alternating with exposed non-conductive or plastic regions of the underlying bonding layer 32. In cases where the conductive trace 14 is a metal and where the adhesive 23 is electrically conductive, the lid 11 may also be electrically connected to metal traces within the package substrate 12. For some RF shielding applications, the conductive trace 14 may desirably be electrically connected to ground to enhance RF shielding of the packaged integrated device 60.

FIG. 4C illustrates a cross-section of the packaged integrated device 60, taken along lines 4C-4C of FIG. 4A. Unlike FIG. 4B, this cross-section illustrates a section of the packaged integrated device 60 that does not include a locking feature 61 at the perimeter of the lid 11. As disclosed above, in some cases, it therefore may be desirable to directly attach the lid 11 to the exposed portions of the bonding layer 32 of the package substrate 12, particularly in areas of the package substrate 12 where no locking features 61 are formed. A skilled artisan will appreciate that adhesion may be improved by using the first conductive layer 11a and the alternately exposed bonding layer 32 either alone or in combination with one another.

In some embodiments, the bonding layer 32 can be any suitable nonconductive or pre-impregnated composite material layer, including, for example, Bismaleimide-Triazine (BT) resin. Additionally, the conductive trace 14 can be any suitable conductive layer, including, for example, copper, or copper plated with nickel and/or gold.

Providing the first conductive layer 11a and the locking features 61 can aid in increasing lid attachment strength, as was described above. However, as will be appreciated by the skilled artisan, both features need not be included, and either feature can be employed individually to improve lid attachment strength. In addition, as described in some embodiments above, the second conductive layer 11c may also define the exterior surface 19 of the packaged integrated device 60. When the material for the second conductive layer 11c is selected to enhance RF shielding, then the lid 11 may also offer improved RF shielding, in addition to improved adhesion to the package substrate 12.

Figure 5:
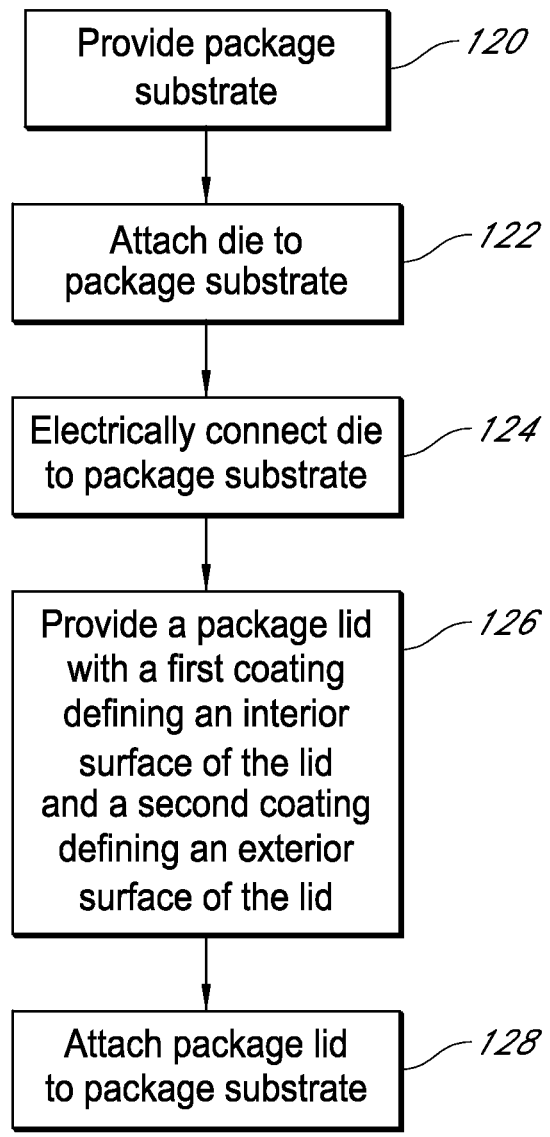
FIG. 5 is an example flowchart illustrating a process for packaging an integrated device.

Turning to FIG. 5, a flowchart showing one example process for packaging an integrated device is provided. In Block 120, a package substrate is provided. In some embodiments, the package substrate may be a PCB, but any other suitable package substrate may be used, including, for example, leadframe-based substrates. Selected layers of the package substrate may be optionally patterned to form locking features. For instance, the package substrate may include a conductive layer and a bonding layer. The conductive layer can be patterned to expose the bonding layer, which may be configured to adhere strongly with a package lid. The patterned area may form conductive locking features alternated with regions of exposed bonding layer on the package substrate, as described in some embodiments above.

A die is attached to the package substrate in Block 122. The die may be an integrated circuit die, or in some embodiments, the die may be a MEMS die. In further embodiments, the die may comprise a microphone die (e.g., a MEMS microphone die), as described above. In some embodiments, multiple dies are attached to the substrate, such as a MEMS die and an ASIC for processing signals to or from the MEMS die. In Block 124, the die is electrically connected to the package substrate. In some cases, this may be done using metal bonding wires, but other methods of electrical connection may be suitable.

In Block 126, a package lid is provided. In some embodiments, the package lid includes an interior surface that faces the interior of the packaged device and an exterior surface that faces outside the package. A first coating selected to enhance bonding between the lid and an adhesive (such as a conductive epoxy) may define the interior surface of the lid. A second coating selected to enhance RF shielding may define the exterior surface of the lid. FIGS. 2A-2E illustrate example processes for forming such a lid. In one embodiment, tin may be used to define the exterior surface of the lid, while nickel may be used to define the interior surface of the lid. Although Block 126 shows that providing a package lid may occur after providing a package substrate, attaching the die, and electrically connecting the die, in some embodiments, the package lid may be provided at any point in the process. The order illustrated in the flow chart of FIG. 5 is illustrative only, as the steps may be performed in any feasible order.

In Block 128, the lid is attached to the package substrate. As described in above embodiments, the lid can be attached to the package substrate using an adhesive, such as a conductive epoxy. In embodiments having locking features, the lid can also be attached to the package substrate by contacting the adhesive with locking features of the package substrate. In some cases, the adhesive alternately contacts the locking features and exposed portions of the bonding layer of the package substrate.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A packaged integrated device, comprising:
a package substrate;
a package lid attached to the package substrate using an adhesive, the package lid and the package substrate defining a package interior, wherein the package lid includes a first conductive layer, a second conductive layer and a core disposed between the first and second conductive layers, wherein the first conductive layer defines a first surface of the package lid facing the package interior, and wherein the second conductive layer defines a second surface of the package lid opposite the first surface, and wherein a portion of the first conductive layer contacts the adhesive; and
an integrated device die mounted within the package interior,
wherein the first and second conductive layers comprise different materials,
wherein the package substrate includes a nonconductive layer and a conductive trace disposed on the nonconductive layer, and wherein the package lid is mounted to portions of both the conductive trace and the nonconductive layer using the adhesive, and
wherein the first surface of the package lid includes an interface surface for mounting the package lid to the package substrate using the adhesive, and wherein the conductive trace is patterned to alternately expose portions of the nonconductive layer and the conductive trace to the adhesive around an annular pattern corresponding to the interface surface.

2. The packaged integrated device of claim 1, wherein the package lid is mounted to a surface of the package substrate.

3. The packaged integrated device of claim 1, wherein the package lid is shaped to be substantially planar.

4. The packaged integrated device of claim 1, wherein the adhesive is an epoxy.

5. The packaged integrated device of claim 1, wherein the first conductive layer has an attachment strength to the adhesive which is greater than that of the second conductive layer.

6. The packaged integrated device of claim 5, wherein the second conductive layer has a radio frequency conductivity less than that of the first conductive layer.

7. The packaged integrated device of claim 1, wherein the second conductive layer comprises tin (Sn) and the first conductive layer comprises nickel (Ni).

8. The packaged integrated device of claim 1, wherein the first conductive layer comprises a metal selected from group consisting of nickel (Ni), silver (Ag), gold (Au), and copper (Cu).

9. The packaged integrated device of claim 1, wherein the second conductive layer comprises a metal selected from the group consisting of tin (Sn), silver (Ag), gold (Au), and copper (Cu).

10. The packaged integrated device of claim 1, wherein the integrated device die is a MEMS device die.

11. The packaged integrated device of claim 1, wherein the integrated device die is an integrated circuit die.

12. The packaged integrated device of claim 1, wherein the integrated device die is a microphone device die.

13. The packaged integrated device of claim 12, wherein the package substrate includes a sound port therethrough for communicating sound from outside the packaged integrated device to the package interior.

14. The packaged integrated device of claim 13, wherein the microphone device die is mounted to a first surface of the package substrate over the sound port.

15. The packaged integrated device of claim 1, wherein the nonconductive layer is a pre-impregnated composite material layer.

16. The packaged integrated device of claim 1, wherein the conductive trace comprises copper.

17. A packaged integrated device, comprising:
a package substrate;
a package lid attached to the package substrate using an adhesive, the package lid and the package substrate defining a package interior, wherein the package lid includes a first conductive layer, a second conductive layer and a core disposed between the first and second conductive layers, wherein the first conductive layer defines a first surface of the package lid facing the package interior, and wherein the second conductive layer defines a second surface of the package lid opposite the first surface, and wherein a portion of the first conductive layer contacts the adhesive; and
an integrated device die mounted within the package interior,
wherein the first and second conductive layers comprise different materials,
wherein the core comprises at least one of stainless steel, copper (Cu), aluminum (Al) and a liquid crystal polymer (LCP).

18. The packaged integrated device of claim 17, wherein the core comprises stainless steel.

19. The packaged integrated device of claim 17, wherein the adhesive is an epoxy.

20. The packaged integrated device of claim 17, wherein the package substrate includes a nonconductive layer and a conductive trace disposed on the nonconductive layer, and wherein the package lid is mounted to portions of both the conductive trace and the nonconductive layer using the epoxy.

* * * * *